US012567455B2

(12) United States Patent
Huang et al.

(10) Patent No.: US 12,567,455 B2
(45) Date of Patent: Mar. 3, 2026

(54) REFERENCE POTENTIAL GENERATING CIRCUIT AND CONTROL METHOD THEREOF

(71) Applicant: REALTEK SEMICONDUCTOR CORP., Hsinchu (TW)

(72) Inventors: Kuo-Lun Huang, Hsinchu (TW); Kuo-Wei Chi, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 128 days.

(21) Appl. No.: 18/407,830

(22) Filed: Jan. 9, 2024

(65) Prior Publication Data

US 2024/0233805 A1     Jul. 11, 2024

(51) Int. Cl.
*G11C 11/4074* (2006.01)

(52) U.S. Cl.
CPC ................................ *G11C 11/4074* (2013.01)

(58) Field of Classification Search
CPC ....................................................... G11C 7/14
See application file for complete search history.

(56) References Cited

U.S. PATENT DOCUMENTS

| | | | | |
|---|---|---|---|---|
| 6,486,817 | B1 * | 11/2002 | Okada | H03M 1/682 |
| | | | | 341/154 |
| 2010/0188918 | A1 | 7/2010 | Fox et al. | |
| 2010/0321362 | A1 * | 12/2010 | Weng | G09G 3/3688 |
| | | | | 345/211 |
| 2014/0149654 | A1 | 5/2014 | Venkatesan et al. | |
| 2020/0112654 | A1 * | 4/2020 | Saito | G09G 3/3233 |
| 2020/0302990 | A1 * | 9/2020 | Bae | G11C 7/1084 |
| 2020/0380904 | A1 * | 12/2020 | Yeh | G09G 3/3696 |
| 2022/0045701 | A1 * | 2/2022 | Roh | H03F 3/45183 |

* cited by examiner

*Primary Examiner* — Douglas King
(74) *Attorney, Agent, or Firm* — Birch, Stewart, Kolasch & Birch, LLP

(57) ABSTRACT

A reference potential generating circuit includes at least one upper-potential selection switch, at least one lower-potential selection switch, a resistor string and at least one multiplexer. Each upper-potential selection switch receives an upper-voltage signal, and one of the upper-potential selection switches is turned on. Each lower-potential selection switch receives a lower-voltage signal, and one of the lower-potential selection switches is turned on. The resistor string is coupled between the upper-potential selection switch and the lower-potential selection switch. The multiplexer includes a plurality of input ends and an output end. The input ends are coupled to ends of the resistors one to one, and the output end of one of the multiplexers outputs a reference potential signal. A control method for the aforementioned reference potential generating circuit is further provided here.

7 Claims, 6 Drawing Sheets

REFERENCE POTENTIAL GENERATING CIRCUIT AND CONTROL METHOD THEREOF

CROSS-REFERENCE TO RELATED APPLICATION

This non-provisional application claims priority under 35 U.S.C. § 119(a) to Patent Application No. 112101256 filed in Taiwan, R.O.C. on Jan. 11, 2023, the entire contents of which are hereby incorporated by reference.

BACKGROUND

Technical Field

The present disclosure relates to a potential generating circuit, and in particular to a reference potential generating circuit suitable for memory apparatus and a control method thereof.

Related Art

At present, in order to reduce costs, memories of different generations and specifications will be combined in a memory product. In such memory products, multiple data receiving units receive a same reference potential signal. However, when a reference potential is not accurate enough, interpretation of the received data signal will be affected.

SUMMARY

In view of this, an example of the present disclosure provides a reference potential generating circuit, suitable for memory apparatus, and including at least one upper-potential selection switch, at least one lower-potential selection switch, a resistor string and at least one multiplexer. Each upper-potential selection switch receives an upper-voltage signal, and one of the upper-potential selection switches is turned on. Each lower-potential selection switch receives a lower-voltage signal, and one of the lower-potential selection switches is turned on. The resistor string is coupled between the upper-potential selection switch and the lower-potential selection switch, and the resistor string includes a plurality of resistors in series. The multiplexer includes a plurality of input ends and an output end. The input ends are coupled to ends of the resistors one to one, and the output end of one of the multiplexers outputs a reference potential signal.

An example of the present disclosure further provides a control method for the aforementioned reference potential generating circuit. The aforementioned input/output circuit includes a plurality of receiving units. The control method includes: turning on one of the upper-potential selection switches; turning on one of the lower-potential selection switches; selecting output of one of the multiplexers as the reference potential signal; sampling a data signal received by one of the receiving units, and interpreting a plurality of data bits and a plurality of edge bits between the data bits according to the reference potential signal; and when the edge bits are a same level signal and the data bits are not the same level signal, selecting output of another multiplexer as the reference potential signal.

According to the reference potential generating circuit and the control method thereof in some examples of the present disclosure, an adjustable reference potential signal can be provided, and whether the reference potential signal needs to be adjusted can be judged according to the edge bits. In addition, the reference potential generating circuit and the control method thereof are suitable for a memory circuit including a plurality of double data rate synchronous dynamic random access memories of different generations, and can provide appropriate upper-voltage signal and lower-voltage signal.

DETAILED DESCRIPTION

Figure 1:
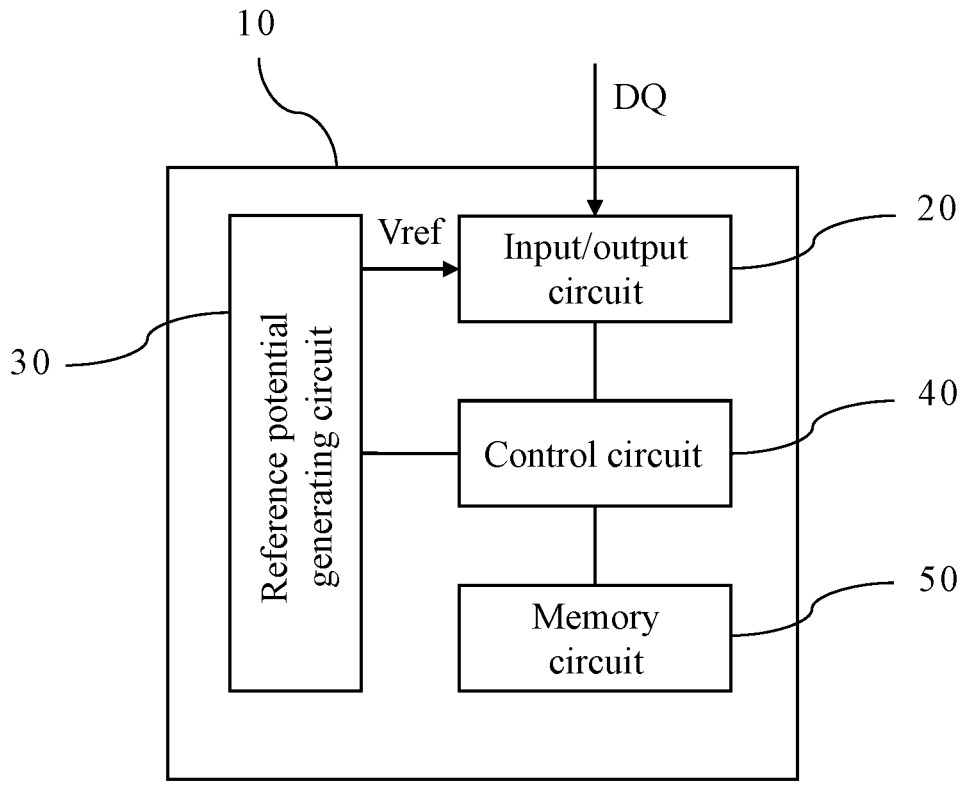
FIG. 1 is a schematic architectural diagram of a memory apparatus of an example of the present disclosure.

Referring to FIG. 1, it is a schematic architectural diagram of a memory apparatus 10 of an example of the present disclosure. The memory apparatus 10 includes an input/output circuit 20, a reference potential generating circuit 30, a control circuit 40 and a memory circuit 50. The input/output circuit 20 is coupled to the reference potential generating circuit 30. The control circuit 40 is coupled to the input/output circuit 20, the reference potential generating circuit 30 and the memory circuit 50. The input/output circuit 20 is configured to receive a data signal DQ.

Figure 2:
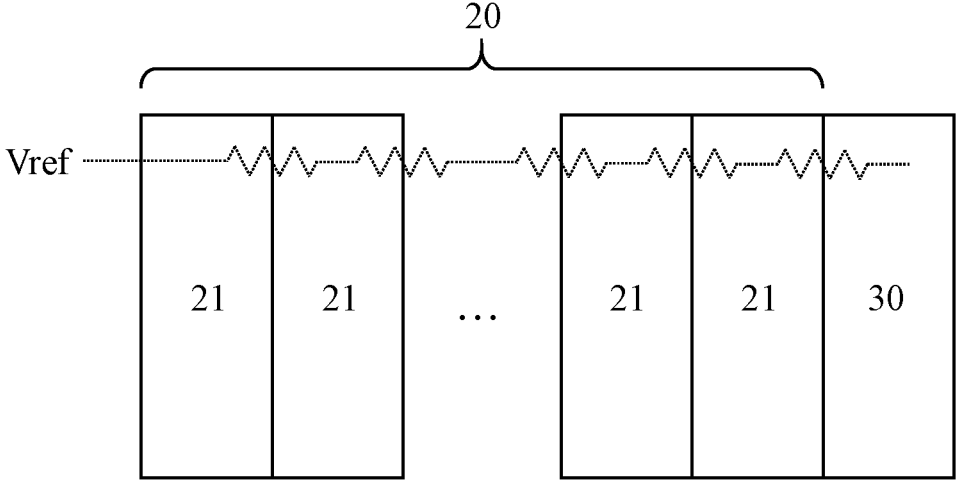
FIG. 2 is a schematic architectural diagram of an input/output circuit and a reference potential generating circuit of an example of the present disclosure.

Referring to FIG. 2, it is a schematic architectural diagram of an input/output circuit 20 and a reference potential generating circuit 30 of an example of the present disclosure. The input/output circuit 20 includes a plurality of input/output units 21. The number of these input/output units 21 may be 8, and their data transmission width is 8 bits. The number of the input/output units 21 may be 16, and their data transmission width is 16 bits. These input/output units 21 share a reference potential signal Vref generated by a same reference potential generating circuit 30.

Figure 3:
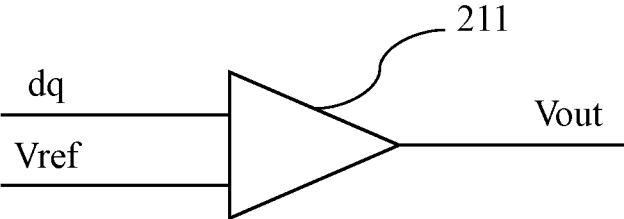
FIG. 3 is a schematic partial diagram of an input/output unit of an example of the present disclosure.

Referring to FIG. 3, it is a schematic partial diagram of an input/output unit 21 of an example of the present disclosure. Here, the receiving unit 211 of the input/output unit 21 receiving the reference potential signal Vref and a data signal dq is presented (different from that of the aforementioned data signal DQ, the data width of the data signal dq here is one bit, i.e., one of the bits of the data signal DQ). The receiving unit 211 of the input/output unit 21 interprets the received data signal dq according to the reference potential signal Vref to obtain an output signal Vout. That is, based on the reference potential signal Vref, if the data signal dq is higher than the reference potential signal Vref, the data signal dq of positive logic (high level) is obtained. Conversely, if the data signal dq is lower than the reference potential signal Vref, data signal dq of negative logic (low level) is obtained.

Figure 4:
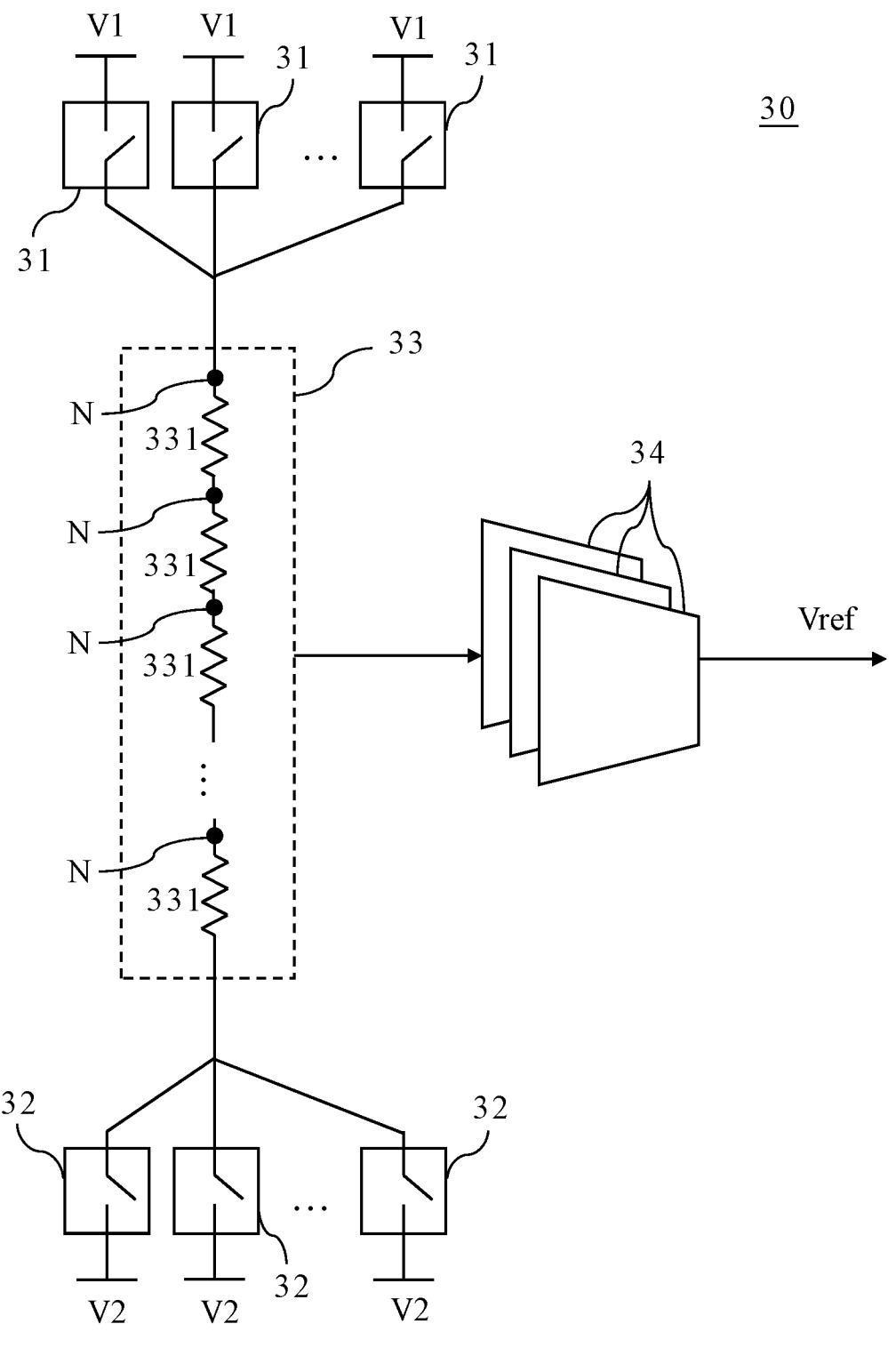
FIG. 4 is a schematic architectural diagram of a reference potential generating circuit of an example of the present disclosure.

In order to overcome the problem that the level offset of the reference potential signal Vref is caused by voltage drop (IR drop) or noise interference caused by line layout, thus resulting in wrong interpretation of the data signal dq, the present disclosure proposes a reference potential generating circuit 30, and a voltage level of the output reference potential signal Vref of the reference potential generating circuit can be adjusted. Referring to FIG. 4, it is a schematic architectural diagram of a reference potential generating circuit 30 of an example of the present disclosure. The reference potential generating circuit 30 includes at least one upper-potential selection switch 31, at least one lower-potential selection switch 32, a resistor string 33 and at least one multiplexer 34.

Each upper-potential selection switch 31 receives an upper-voltage signal V1, and a voltage value of the upper-voltage signal V1 received by each upper-potential selection switch 31 is different. One of these upper-potential selection switches 31 is configured to be turned on.

Each lower-potential selection switch 32 receives a lower-voltage signal V2, and a voltage value of the lower-voltage signal V2 received by each lower-potential selection switch 32 is different. One of these lower-potential selection switches 32 is configured to be turned on.

The resistor string 33 is coupled between these upper-potential selection switch 31 and these lower-potential selection switch 32, so that a cross voltage of the resistor string 33 is defined by the voltage value of the upper-voltage signal V1 received by the upper-potential selection switch 31 being turned on and the voltage value of the lower-voltage signal V2 received by the lower-potential selection switch 32 being turned on (that is, (V1-V2)).

In some examples, the memory circuit 50 includes a plurality of double data rate synchronous dynamic random access memories (DDR SDRAMs) of different generations. In order to meet the requirements and specifications of these DDR SDRAMs of different generations (such as hybrid DDR3 and DDR4, hybrid LPDDR4 and LPDDR5, and hybrid DDR4 and LPDDR4), the upper-potential selection switch 31 and the lower-potential selection switch 32 that provide appropriate voltage values can be turned on. By way of examples, in one mode, the upper-potential selection switch 31 being turned on provides the upper-voltage signal V1 of 90% of a power supply voltage, and the lower-potential selection switch 32 being turned on provides the lower-voltage signal V2 of 10% of the power supply voltage. In another mode, the upper-potential selection switch 31 being turned on provides the upper-voltage signal V1 of 55% of a power supply voltage, and the lower-potential selection switch 32 being turned on provides the lower-voltage signal V2 of 5% of the power supply voltage.

The resistor string 33 includes a plurality of resistors 331 in series. In some examples, resistance values of these resistors 331 are the same. However, the present disclosure is not limited to this, and the resistance values of these resistors 331 may also be different. The number of the resistors 331 determines how subtle the reference potential signal Vref can be adjusted (i.e., adjustment resolution). Taking the aforementioned upper-voltage signal V1 being 90% of the power supply voltage and the lower-voltage signal V2 being 10% of the power supply voltage as an example, the cross voltage of the resistor string 33 is 80% of the power supply voltage. If the resistor string 33 includes 80 resistors 331, a cross voltage of each resistor 331 is 1% of the power supply voltage.

The ends of all the resistors 331 (nodes N in FIG. 4) are coupled to a plurality of input ends of the multiplexer 34 one to one, and then output of an output end of the multiplexer 34 is the voltage signal of one of the input ends (i.e., a voltage value of a certain node N). When the output of each multiplexer 34 corresponds to the voltage values of different nodes N, the purpose of adjusting the reference potential signal Vref can be achieved by selecting output of a different multiplexer 34 as the reference potential signal Vref.

By way of examples, the reference potential signal Vref (hereinafter referred to as a first reference potential signal Vref) output by a first multiplexer 34 may be an intermediate value of the cross voltage of the resistor string 33 (such as 50% of the power supply voltage), the reference potential signal Vref (hereinafter referred to as a second reference potential signal Vref) output by a second multiplexer 34 may be the first reference potential signal Vref+1% of the power supply voltage (i.e., a previous node N of a node N in the center of the resistor string 33), and the reference potential signal Vref (hereinafter referred to as a third reference potential signal Vref) output by a third multiplexer 34 may be the first reference potential signal Vref–1% of the power supply voltage (i.e., a next node N of the node N in the center of the resistor string 33). Here, although it is illustrated with three multiplexers 34, the present disclosure is not limited to this number. Moreover, a difference of the reference potential signals Vref between the two multiplexers 34 is not limited to the cross voltage of one resistor 331.

Figure 5:
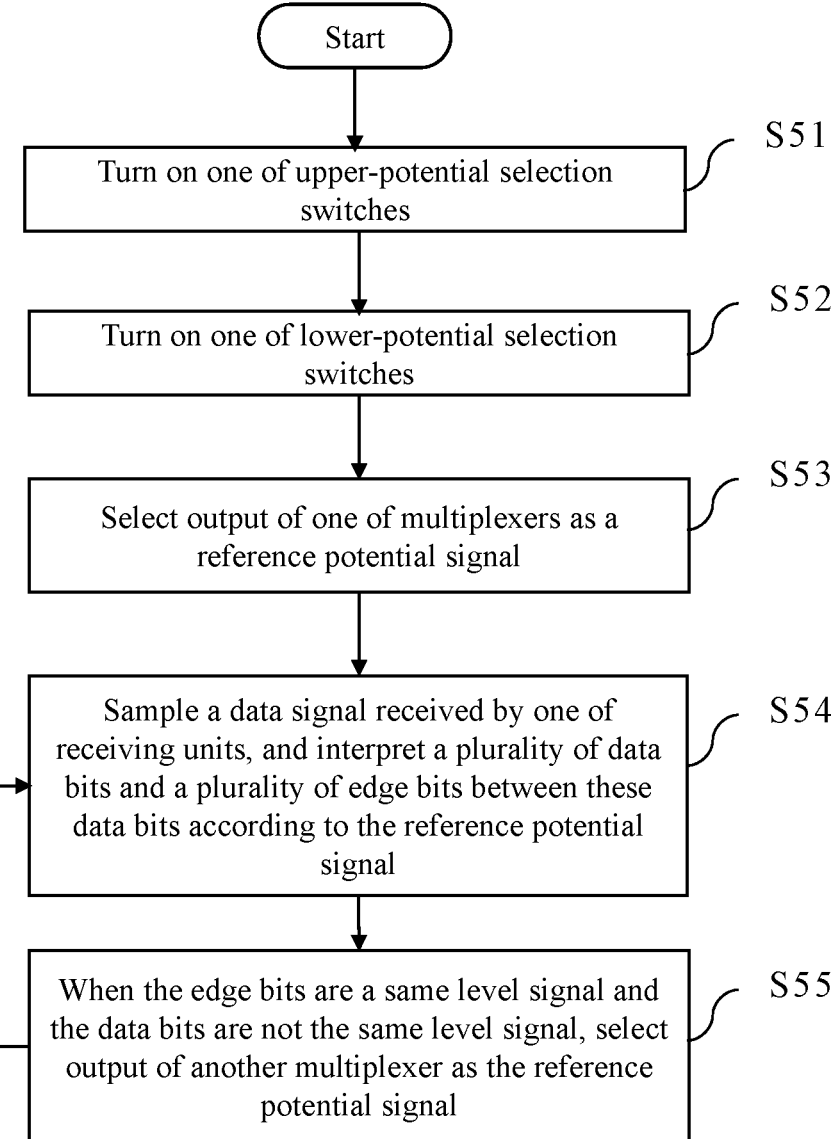
FIG. 5 is a flowchart of a control method for the aforementioned reference potential generating circuit of an example of the present disclosure.

Referring to FIG. 5, it is a flowchart of a control method for the aforementioned reference potential generating circuit 30 of an example of the present disclosure. This control method may be executed by the aforementioned control circuit 40. The control circuit 40 may be a controller, such as a memory controller. First, one of the upper-potential selection switches 31 (step S51) is turned on, and one of the lower-potential selection switches 32 (step S52) is turned on. In some examples, the execution order of step S51 and step S52 is interchangeable.

Next, the output of one of the multiplexers 34 is selected as the reference potential signal Vref (step S53). For example, the output is set as the aforementioned first reference potential signal Vref, i.e., the intermediate value of the cross voltage of the resistor string 33.

Figure 6:
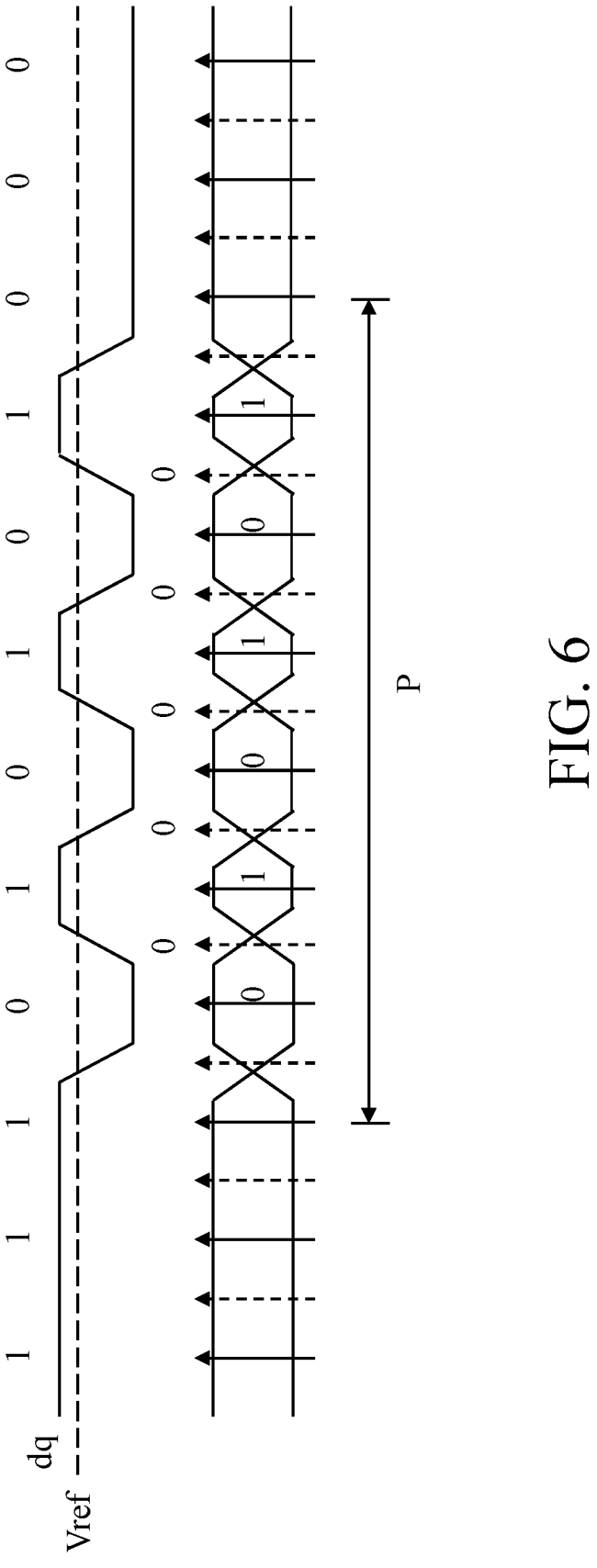
FIG. 6 is a schematic diagram of data bits and edge bits interpreted according to an excessively high reference potential signal of an example of the present disclosure.

Referring to FIGS. 5 and 6, FIG. 6 is a schematic diagram of data bits and edge bits interpreted according to an excessively high reference potential signal Vref of an example of the present disclosure. In step S54, the data signal dq received by one of the receiving units 211 is sampled, and the plurality of data bits and the plurality of edge bits between the data bits are interpreted from the data signal dq according to the reference potential signal Vref within a sampling interval P. As shown in FIG. 6, the data bits are (0, 1, 0, 1, 0, 1) in order, and the edge bits are (0, 0, 0, 0, 0) in order.

In step S55, it is judged whether the edge bits are all a same level signal according to an interpretation result in step S54. If yes, it indicates that the reference potential signal Vref may need to be adjusted due to being too high or too low. However, in order to avoid that the data bits and edge bits are the same level signal due to other unexpected factors, a misjudgment requires an adjustment of the reference potential signal Vref. Therefore, in addition to judging that the edge bits are the same level signal, it will be confirmed that the data bits are not the same level signal.

When the edge bits are the same level signal and the data bits are not the same level signal, the output of another multiplexer 34 is selected as the reference potential signal Vref. Specifically, as shown in FIG. 6, the edge bits are all a low-level signal. At this time, another multiplexer 34 with lower level output will be selected as the reference potential signal Vref, so that the voltage level of the excessively high reference potential signal Vref can be reduced. For example, the aforementioned first reference potential signal Vref is changed to the aforementioned third reference potential signal Vref (the first reference potential signal Vref−1% of the power supply voltage).

Figure 7:
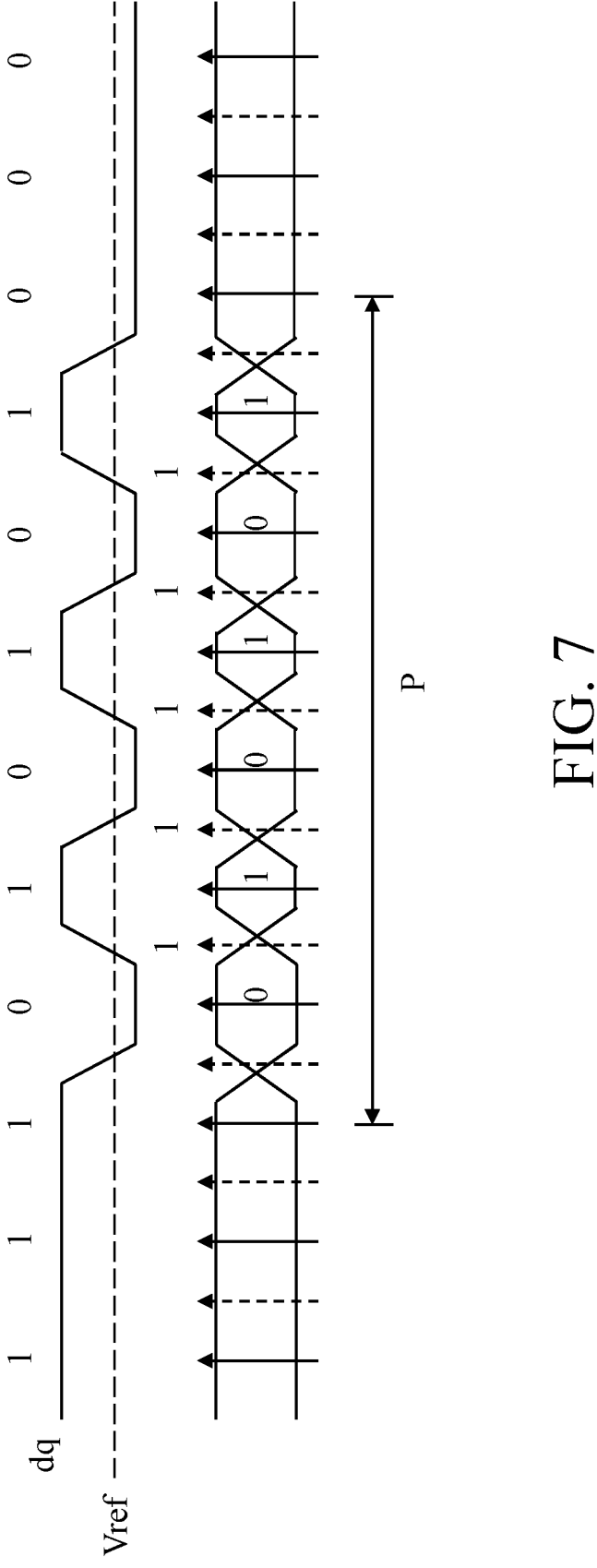
FIG. 7 is a schematic diagram of data bits and edge bits interpreted according to an excessively low reference potential signal of an example of the present disclosure.

FIG. 7 is a schematic diagram of data bits and edge bits interpreted according to an excessively low reference potential signal Vref of an example of the present disclosure. As shown in FIG. 7, the data bits are (0, 1, 0, 1, 0, 1) in order, and the edge bits are (1, 1, 1, 1, 1) in order. That is, the edge bits are all a high-level signal. At this time, another multiplexer 34 with higher level output will be selected as the reference potential signal Vref, so that the voltage level of the excessively low reference potential signal Vref can be reduced. For example, the aforementioned first reference potential signal Vref is changed to the aforementioned second reference potential signal Vref (the first reference potential signal Vref+1% of the power supply voltage).

After step S55 is performed, return to step S54 to further sample the data bits and edge bits, and following step S55, it is confirmed whether the adjusted reference potential signal Vref is still excessively high or excessively low. If any, the reference potential signal Vref is adjusted according to the aforementioned method, which will not be repeated here.

In some examples, in the aforementioned step S55, if it is judged that the conditions necessary for adjusting the reference potential signal Vref are met (that is, the edge bits are all the same level signal and the data bits are not the same level signal), the reference potential signal Vref will not be adjusted immediately, but returns to step S54 again for resampling for repeated judgment, and when results of multiple judgments meet the conditions necessary for adjusting the reference potential signal Vref, the reference potential signal Vref is adjusted. Accordingly, the misjudgment caused by noise interference can be avoided sometimes.

To sum up, according to the reference potential generating circuit 30 and the control method thereof in some examples of the present disclosure, an adjustable reference potential signal Vref can be provided, and whether the reference potential signal Vref needs to be adjusted can be judged according to the edge bits. In addition, the reference potential generating circuit 30 and the control method thereof are suitable for a memory circuit 50 including a plurality of double data rate synchronous dynamic random access memories of different generations, and can provide appropriate upper-voltage signal V1 and lower-voltage signal V2.

What is claimed is:

1. A reference potential generating circuit, being suitable for a memory apparatus, wherein the memory apparatus comprises:

an input/output circuit, coupled to the reference potential generating circuit to receive a reference potential signal therefrom, and interpreting a received data signal according to the reference potential signal to obtain an output signal; and a control circuit, coupled to the reference potential generating circuit and the input/output circuit, the input/output circuit comprises a plurality of receiving units, and the control circuit samples the data signal received by one of the receiving units, and interprets a plurality of data bits and a plurality of edge bits between the data bits according to the reference potential signal; and the reference potential generating circuit comprises:

at least one upper-potential selection switch, each of the at least one upper-potential selection switch receiving an upper-voltage signal, and one of the at least one upper-potential selection switch being turned on;

at least one lower-potential selection switch, each of the at least one lower-potential selection switch receiving a lower-voltage signal, and one of the at least one lower-potential selection switch being turned on;

a resistor string, coupled between the at least one upper-potential selection switch and the at least one lower-potential selection switch, the resistor string comprising a plurality of resistors in series; and at least one multiplexer, each of the at least one multiplexer comprising a plurality of input ends and an output end, the input ends being coupled to ends of the resistors one to one, and the output end of one of the at least one multiplexer outputting the reference potential signal;

wherein when the edge bits are all a same level signal and the data bits are not the same level signal, the control circuit is configured to select another multiplexer to output the reference potential signal.

2. The reference potential generating circuit according to claim 1, wherein when the edge bits are all a low level signal, the control circuit is configured to select another multiplexer with lower level output as the reference potential signal.

3. The reference potential generating circuit according to claim 1, wherein when the edge bits are all a high level signal, the control circuit is configured to select another multiplexer with higher level output as the reference potential signal.

4. The reference potential generating circuit according to claim 1, wherein the memory apparatus comprises a memory circuit, coupled to the control circuit, and the memory circuit comprises a plurality of double data rate synchronous dynamic random access memories of different generations.

5. A control method for a reference potential generating circuit, wherein the reference potential generating circuit is coupled to an input/output circuit comprising a plurality of receiving units, and comprises:

at least one upper-potential selection switch, each of the at least one upper-potential selection switch receiving an upper-voltage signal;

at least one lower-potential selection switch, each of the at least one lower-potential selection switch receiving a lower-voltage signal;

a resistor string, coupled between the at least one upper-potential selection switch and the at least one lower-potential selection switch, the resistor string comprising a plurality of resistors in series; and at least one multiplexer, each of the at least one multiplexer comprising a plurality of input ends and an output end, the input ends being coupled to ends of the resistors one to one; and the control method comprises:

turning on one of the at least one upper-potential selection switch;

turning on one of the at least one lower-potential selection switch;

selecting the output of one of the at least one multiplexer as the reference potential signal;

sampling a data signal received by one of the receiving units, and interpreting a plurality of data bits and a plurality of edge bits between the data bits according to the reference potential signal; and when the edge bits are a same level signal and the data bits are not the same level signal, selecting the output of another multiplexer as the reference potential signal.

6. The control method according to claim 5, wherein when the edge bits are all a low level signal, another multiplexer with lower level output is selected as the reference potential signal.

7. The control method according to claim 5, wherein when the edge bits are all a high level signal, another multiplexer with higher level output is selected as the reference potential signal.

\* \* \* \* \*